(12) United States Patent
Albertson et al.

(10) Patent No.: US 10,426,030 B2
(45) Date of Patent: Sep. 24, 2019

(54) TRACE/VIA HYBRID STRUCTURE MULTICHIP CARRIER

(71) Applicant: INTERNATIONAL BUSINESS MACHINES CORPORATION, Armonk, NY (US)

(72) Inventors: Chad M. Albertson, Rochester, MN (US); Eric J. Campbell, Rochester, MN (US); Nicholas J. Ollerich, Rochester, MN (US); Christopher W. Steffen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/493,680

(22) Filed: Apr. 21, 2017

(65) Prior Publication Data
US 2018/0310403 A1    Oct. 25, 2018

(51) Int. Cl.
*H05K 1/11*  (2006.01)
*H05K 3/00*  (2006.01)
(Continued)

(52) U.S. Cl.
CPC ............ *H05K 1/112* (2013.01); *H05K 1/115* (2013.01); *H05K 3/0014* (2013.01); *H05K 3/146* (2013.01); *H05K 3/3405* (2013.01); *H05K 3/3436* (2013.01); *H05K 2201/09636* (2013.01); *H05K 2201/09836* (2013.01); *H05K 2201/09945* (2013.01); *Y10T 29/49155* (2015.01)

(58) Field of Classification Search
CPC ...... H05K 1/112; H05K 1/115; H05K 3/0014; H05K 3/146; H05K 3/3405; H05K 3/3436; H05K 2201/09636; H05K 2201/09836; H05K 2201/09945; Y10T 29/49155; Y10T 29/49153; Y10T 29/4913; Y10T 29/49124; Y10T 29/49117; Y10T 29/49002
USPC .......................................................... 29/846
See application file for complete search history.

(56) References Cited

U.S. PATENT DOCUMENTS 8,076,179 B2    12/2011  Takatsuki
8,159,053 B2     4/2012  Andrews, Jr. et al.
(Continued)

FOREIGN PATENT DOCUMENTS

CN          105428260 A      3/2016

OTHER PUBLICATIONS

EE Times: "Design How-To 2D vs. 2.5D vs. 3D ICs 101" accessed on Nov. 15, 2016, pp. 1-9, http://www.eetimes.com/document.asp?doc_id=1279540.

*Primary Examiner* — Peter Dungba Vo
*Assistant Examiner* — Azm A Parvez
(74) *Attorney, Agent, or Firm* — Tutunjian & Bitetto, P.C.; Nathan Rau

(57) ABSTRACT

A method of forming an multi-chip carrier that includes providing a trace structure using an additive forming method. The method includes forming a metal layer on a trace structure to provide electrically conductive lines. A dielectric material may then be formed on the electrically conductive lines to encapsulate a majority of the electrically conductive lines. The ends of the electrically conductive lines that are exposed through the upper surface of the dielectric material provide a top processor mount location and the ends of the electrically conductive lines that are exposed through the sidewalls of the dielectric material provide a sidewall processor mount location.

15 Claims, 5 Drawing Sheets

(51) Int. Cl.
*H05K 3/14* (2006.01)
*H05K 3/34* (2006.01)

(56) References Cited

U.S. PATENT DOCUMENTS

| | | |
|---|---|---|
| 9,106,229 B1 | 8/2015 | Hutton et al. |
| 2005/0251777 A1* | 11/2005 | Bartley ............. H01L 23/49827 174/266 |
| 2006/0087013 A1 | 4/2006 | Hsieh |
| 2014/0238840 A1* | 8/2014 | Lee ........................ B01D 3/143 203/32 |
| 2017/0093007 A1* | 3/2017 | Elsherbini ................. H01P 3/08 |

\* cited by examiner

TRACE/VIA HYBRID STRUCTURE MULTICHIP CARRIER

BACKGROUND

Technical Field

The present invention generally relates to interconnect structures, and more particularly to forming electrically conductive lines having orthogonal portions and curvatures extending through dielectric structures.

Description of the Related Art

Copper wires and interconnects typically seen in printed circuit board (PCBs), interposers, package substrates and multichip arrangements typically include straight interconnect lines. The length of traces, i.e., electrically conductive features, such as interconnect lines, between chips adds wire delay, which is seen as latency to the processor. This latency hurts performance on switching module processors and memory links. Further, the nets with the longer traces needs larger drivers to drive the extra net capacitance which leads to more driver stages, and more power. Longer nets can also result in extra net capacitance, which can be a problem at higher input/output data rates.

SUMMARY

In one embodiment, a method of forming an multi-chip carrier is described herein that includes providing a trace structure using an additive forming method. The trace structure has a geometry for the later formed electrically conductive lines through the substrate of the multi-chip carrier. The geometry includes lines extending from a top processor mount location an upper surface to a base surface of the substrate, as well as extending from the top processor mount location at the upper surface to at least one side processor mount location at a sidewall surface of the substrate. The method continuous with forming a continuous seed metal layer on the trace structure. A metal layer for the electrically conductive lines may be formed on the continuous seed layer. A dielectric material may then be formed on the electrically conductive lines to encapsulate a majority of the electrically conductive lines. The ends of the electrically conductive lines that are exposed through the upper surface are the top processor mount location and the ends of the electrically conductive lines that are exposed through the sidewalls of the substrate are the at least one sidewall processor mount location.

In another embodiment, the method of forming the multi-chip carrier may include providing a trace structure using an additive forming method, in which the sacrificial trace structure has a geometry for the later formed electrically conductive lines through the substrate of the multi-chip carrier. The geometry includes lines extending from a top processor mount location an upper surface to a base surface of the substrate, as well as extending from the top processor mount location at the upper surface to at least one side processor mount location at a sidewall surface of the substrate. The method continuous with forming a continuous seed metal layer on the trace structure. A metal layer for the electrically conductive lines may be formed on the continuous seed layer. A dielectric material may then be formed on the electrically conductive lines to encapsulate a majority of the electrically conductive lines. Top processor solder bumps can then be formed on the ends of the electrically conductive lines that are exposed through the upper surface at the top processor mount location; and side processor solder bumps can be formed on the ends of the electrically conductive lines that are exposed through the sidewalls of the substrate at the at least one sidewall processor mount location. Thereafter, a top processor is bonded to the top processor solder bumps and a side processor is bonded to the side processor solder bumps.

In another aspect, an multi-chip carrier structure is provided that includes a dielectric base material, and electrically conductive lines extending through the dielectric base material. The electrically conductive lines include a first set of electrically conductive lines extending from a top processor mount location at a top surface of the dielectric base material to an opposing base surface of the dielectric base material, and a second set of electrically conductive lines extending from a top processor mount location at a top surface of the dielectric material to a sidewall surface of the dielectric base material at a side processor mount location. At least one electrically conductive line of the first and second sets of electrically conductive lines is non-linear. In some embodiments, the non-linear electrically conductive line includes an orthogonal portion, and in some embodiments the non-linear electrically conductive line includes at least one curvature. Solder bump connections are present on ends of the first and second set of electrically conductive lines at the top processor mount location and the side processor mount location. In some embodiments, the electrically conductive lines may be metal lines.

These and other features will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1A:
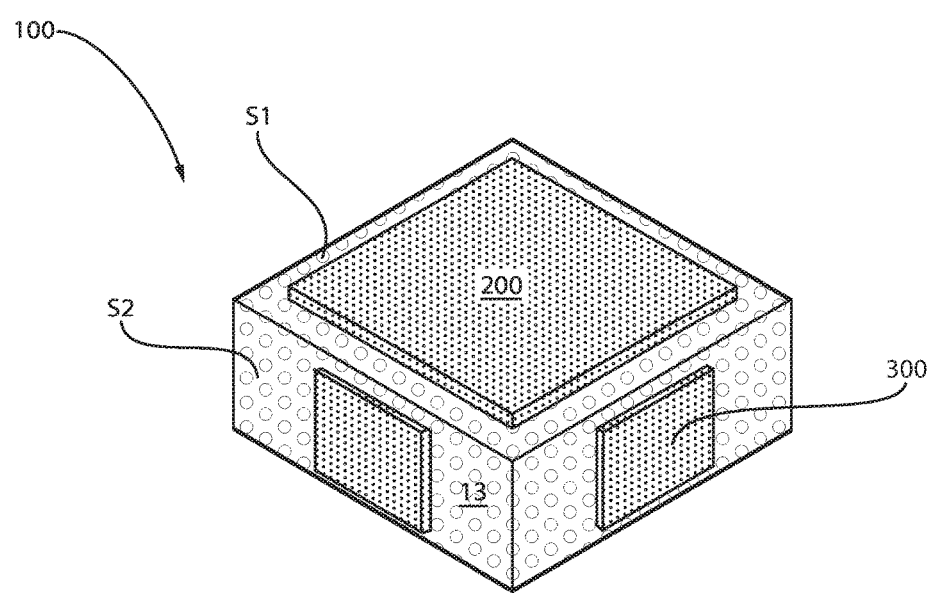
FIG. 1A is a perspective view of a multi-chip carrier in which processors may be mounted to both the upper surfaces of the substrate of the carrier, as well as the sidewall surfaces of the carrier, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Multiple chip arrangements, i.e., multiple processor mounting arrangements, used in electronics can be placed on the same module in two dimension (2D) and two and a half (2.5D) dimension stacking arrangements for reducing trace lengths as the expense of the space occupied by the processors arranged on the circuit board, e.g., motherboard. It has been determined that although three dimensional (3D) chip stacks do not take up the amount of space on the circuit board, e.g., motherboard, that two dimensional (2D) and two and a half dimensional (2.5D) occupy, three dimension (3D) chip stacks are susceptible to cooling difficulties. Further, three dimensional (3D) chip stacks also have a low transistor density due to their use of through silicon vias (TSV) interconnects. The methods and structures described herein mount chips, i.e., processors, on the vertical surfaces (also referred to as non-horizontal surfaces) of the substrate that provides the chip carrier sidewalls, as well as the upper surfaces of the substrate of the chip carrier. The substrate of the chip carrier may also be referred to as the module interposer. The multi-chip carriers described herein that mount processors to the sidewalls and upper surfaces of the chip carrier substrate provide for substantially optimized usage of space on the circuit board, e.g., motherboard, as well as optimized temperature management, e.g., cooling.

For example, when compared to prior three dimensional (3D) stacked chips, the multi-chip carriers described herein that mount processors to the upper surfaces and sidewalls of the substrate for the carrier provide advantages in thermal performance of the primary processor/base die. Further, each chip may be cooled individually. The multi-chip carriers described herein also do not require through silicon vias (TSV). Because the multi-chip carriers do not require TSV structures, the multi-chip carriers that mount processors to the upper and sidewall surfaces of the substrate for the carrier provides increase processor density, i.e., increased chip density.

For example, when compared to prior two dimensional (2D) and two and a half (2.5D) dimensional stacking arrangements, the multi-chip carriers described herein that mount processors to the upper surfaces and sidewalls of the substrate for the carrier provide advantages in the lesser space occupied by the multi-chip carrier on the circuit board, e.g., motherboard. Further, the multi-chip carriers described herein that mount processors to the upper surfaces and sidewalls of the substrate for the carrier provide an increased chip density per square inch on the circuit board in comparison to prior two dimensional (2D) and two and a half (2.5D) dimensional stacking arrangements.

In some embodiments, the methods and structures disclosed herein provide multi-chip carriers, and more particularly provide for forming electrically conductive lines through the dielectric substrate of multi-chip carriers having curvatures and orthogonal portions. In some embodiments, by providing electrically conductive lines having orthogonal portions and curvatures through a dielectric chip carrier substrate, the methods and structures described herein provide for multi-chip carriers in which processors may be mounted to both the upper surfaces of the substrate of the carrier, as well as the sidewall surfaces of the substrate of the carrier.

Electrically conductive lines, such as copper wires and interconnects, used in electronic components, such as chip carriers, printed circuit boards, interposers and package substrates are generally limited to being manufactured in straight horizontal and vertical directions. In some embodiments, the methods and structures disclosed herein manufacture a copper trace, via, pad hybrid structure, including orthogonal and curved pathways. This can allow for shorter interconnect, lower latency and lower impedance in the electrical devices employing the structures and methods described herein.

Figure 1B:
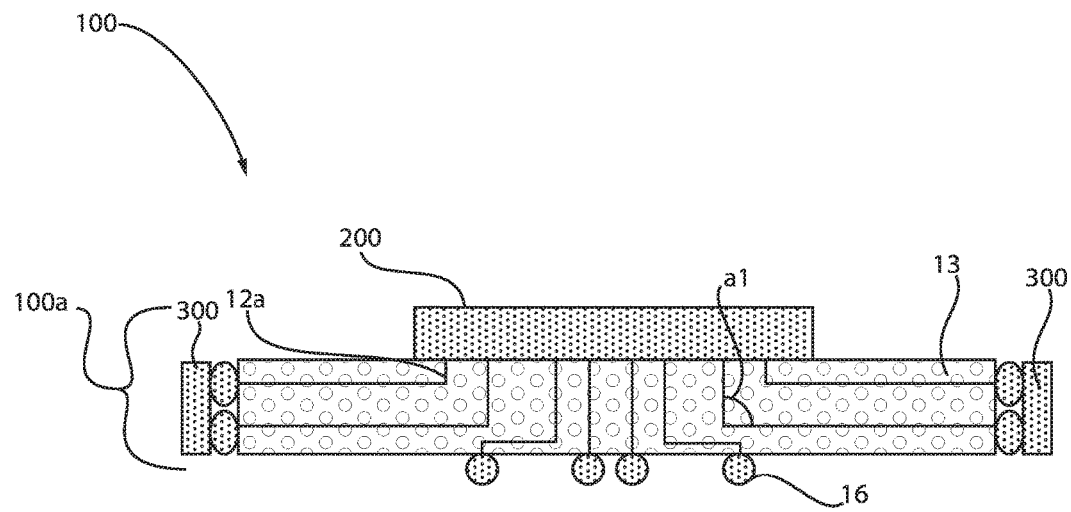
FIG. 1B is a side cross-sectional view depicting one embodiment of a multi-chip carrier including a top processor mount location and a sidewall processor mount location, in which the electrically conductive lines extending between the top processor mount location and the sidewall processor mount locations include orthogonal portions.
Figure 1C:
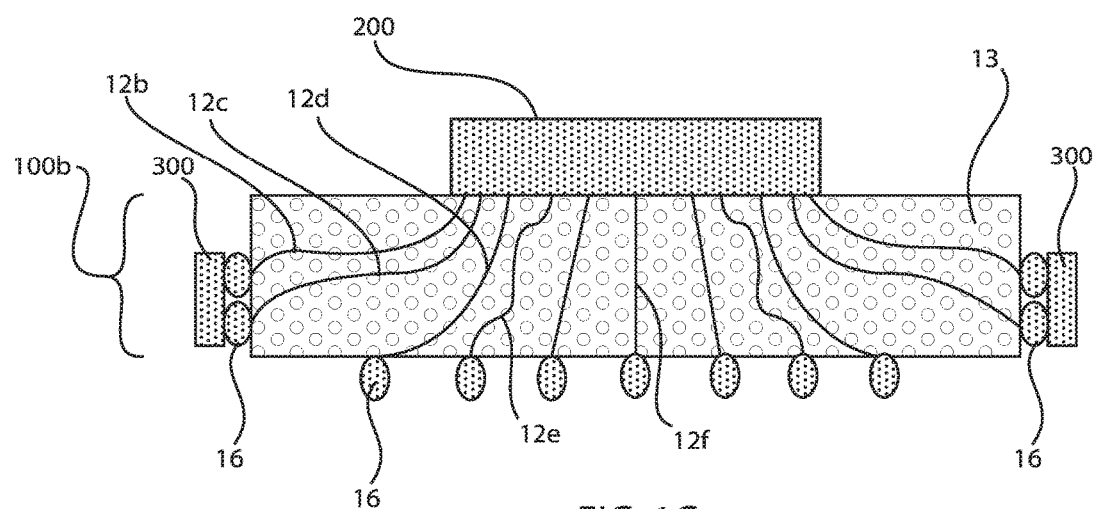
FIG. 1C is a side cross-sectional view depicting one embodiment a multi-chip carrier including a top processor mount location and a sidewall processor mount location, in which the electrically conductive lines extending between the top processor mount location and the sidewall processor mount locations include curved portions.

FIGS. 1A, 1B and 1C illustrate some embodiments, of an multi-chip carrier 100, 100a, 100b within the scope of the present disclosure, that includes a dielectric base material, which may be referred to as a substrate 13, and electrically conductive lines 12a, 12b, 12c, 12d, 12e, 12f, 12g extending through the dielectric base material, i.e., substrate 13. The electrically conductive lines include a first set of electrically conductive lines 12b, 12e, 12f, 12g extending from a top processor mount location S1 at a top surface of the dielectric base material, i.e., substrate 13, to an opposing base surface of the dielectric base material, and a second set of electrically conductive lines 12a, 12c, 12d extending from a top processor mount location S1 at a top surface of the dielectric material, i.e., substrate 13, to a sidewall surface of the dielectric base material at a side processor mount location S2. At least one electrically conductive line 12a, 12b, 12c, 12d, 12e, 12f of the first and second sets of electrically conductive lines is non-linear. In some embodiments, the non-linear electrically conductive line includes an orthogonal portion (as provided the electrically conductive lines having reference numbers 12a and 12b), and in some embodiments the non-linear electrically conductive line includes at least one curvature (as provided by the electrically conductive lines having reference numbers 12c, 12d, 12e and 12f). In some embodiments, the electrically conductive lines may be metal lines.

In some embodiments, the metal based interconnect structure 12a, 12b, 12c, 12d, 12e, 12f, 12g extends through the substrate 13 to provide for electric communication across the multi-chip carrier, e.g., to provide electrical communication to processors 200, 300 mounted to the multi-chip carrier. The term "processor" as used herein is meant to include a central processing unit. A central processing unit (CPU) is the electronic circuitry within a computer that carries out the instructions of a computer program by performing the basic arithmetic, logical, control and input/output (I/O) operations specified by the instructions. But, the term "processor" as used to describe the chips that are connected to the multi-chip carriers 100, 100a, 100b that are disclosed herein also includes memory devices, and microchip including elements, such as mask programmed gate array (MPGA) chips.

As illustrated in FIGS. 1A-1C, a first processor 200 may be mounted to the upper surface of the substrate 13, i.e., mounted to the top processor mount location S1. The first processor 200 can be in electrical communication through the entire thickness of the substrate 13 via a first set of electrically conductive lines 12b, 12e, 12f, 12g extending from a top processor mount location S1 at a top surface of the substrate 13 to an opposing base surface of the substrate 13. The first processor 200 can be bonded to the first set of the electrically conductive lines 12b, 12e, 12f, 12g at the top processor mount location S1 by engagement though solder bumps 16. The opposing side of the substrate 13 is the base surface. The portion of the electrically conductive lines 12b, 12e, 12f, 12g that extend through the base surface of the substrate 13 may be engaged to a circuit board, such as a motherboard, through solder bumps 16. The top processor mount location S1 may be referred to as a horizontally orientated surface. In some examples, the first processor 200 may be a CPU. Although only a single first processor 200 is depicted mounted to the top processor mount location S1, the present disclosure is not limited to only this example. For example, multiple first processors 200 may be mounted to the top processor mount location S1.

Still referring to FIGS. 1A-1C, as second processor 300 may be engaged at a side processor mount location S2 on the sidewall of the substrate 13. In FIG. 1A, the substrate 13 has four sidewalls and may include four second processors 300. This is only one example of a multi-chip carrier within the scope of the present disclosure. The present disclosure is not limited to only this example, because any multi-sided substrate 13 is suitable for use with the present disclosure including substrates 13 having sides equal to 3, 4, 5, 6, 7, 8, 9 and 10, as well as any range of sides including an upper value for the range provided by one of the aforementioned examples and a lower value for the range provide by one of the aforementioned examples.

The second processor 300 mounted on the side processor mount location S2 can be in electrical communication with the first processor 200 on the top processor mount location S1 through the substrate 13 via a second set of electrically conductive lines 12a, 12c, 12d. The second processor 300 can be bonded to a first end of the second set of the electrically conductive lines 12a, 12c, 12d at the side processor mount location S2 on the sidewalls of the substrate 13 by engagement though solder bumps 16; and the first processor 200 can be bonded to a second end of the second set of the electrically conductive lines 12a, 12c, 12d at the top processor mount location S1 on the top surface of the substrate 13 by another set of solder bumps. The side processor mount location S2, i.e., sidewalls of the substrate 13, may be referred to as a vertically orientated surface. In some examples, the second processor 300 may be a memory chip. Although not depicted in FIGS. 1A, 1B and 1C, the second processor 300 that is mounted to the side processor mount location S2 may include electrically conductive lines that extend towards the base surface of the substrate 13, and may include a plurality of solder bumps for engagement to a circuit board, e.g., motherboard.

In some embodiments, the electrically conductive lines 12a, 12b, 12c, 12d, 12e, 12f, 12g may be composed of an electrically conductive metal. "Electrically conductive" as used through the present disclosure means a material typically having a room temperature conductivity of greater than $10^5$ (S/m). In some embodiments, the electrically conductive lines 12a, 12b, 12c, 12d, 12e, 12f, 12g may be comprised of aluminum (Al), copper (Cu), tungsten (W), tantalum (Ta), platinum (Pt), gold (Au), silver (Ag), tin (Sn), and other elemental metals. In another embodiment, the electrically conductive lines 12a, 12b, 12c, 12d, 12e, 12f, 12g may be comprised of metal nitrides, such as tantalum nitride (TaN), titanium nitride (TiN), tungsten nitride (WN), and combinations thereof. The dielectric base material of the substrate 13 may be composed of $SiO_2$, $Si_3N_4$, $SiO_xN$, SiC, SiCO, SiCOH, SiCH compounds, carbon doped oxides, inorganic oxides, inorganic polymers, hybrid polymers, organic polymers, polyimides, polyphenylene oxide, organo-inorganic materials, spin-on glasses, silsesquioxane-based materials, diamond-like carbon (DLC), amorphous hydrogenated carbon and combinations thereof.

As noted above, the electrically conductive lines 12a, 12b, 12c, 12d, 12e, 12g includes non-linear portions. Referring to the multi-chip carrier 100a that is depicted in FIG. 1B, the electrically conductive lines 12a, 12b may include angled portions. For example, linear line portions of the electrically conductive lines 12a, 12b may intersect at orthogonal angles α1, as depicted in FIG. 1B. Orthogonal refers to right angles, i.e., angles of 90°. It is noted that this is only one example of the angle between intersecting linear portions of the electrically conductive lines 12a, 12b. For example, in one embodiment, the angle α1 connecting intersecting liner portions of the electrically conductive lines 12a, 12b may range from 15° to 85°. In other embodiments, the angle α1 connecting intersecting liner portions of the electrically conductive lines 12a, 12b may range from 30° to 60°. In some examples, the angle α1 connecting intersecting liner portions of the electrically conductive lines 12a, 12b may be equal to 15°, 20°, 25°, 30°, 35°, 45°, 55°, 60°, 65°, 70°, 75°, 80°, 85° and 90°.

Referring to the interposer 100b that is depicted in FIG. 1C, the electrically conductive lines 12c, 12d, 12e, 12f may include curved portions. A curve is a line that is not straight. In some embodiments, the curvature of the metal line of the metal based electrically conductive lines is a single arc extending continuously from a first side to a second side of the substrate 13 as identified by reference number 12e. In another embodiment, the curvature of the metal based electrically conductive lines has multiple arcs, as depicted by the structures having reference numbers 12c, 12e and 12f. For example, the curvature may be sigmoidal. In yet other embodiments, the curvature for the metal based electrically conductive lines may include a first arc at a first side of the substrate 13, and a second arc at a second side of the substrate 13, wherein a linear portion of the metal based interconnect structure is present therebetween, as illustrated by the structure having reference number 12c. In yet another embodiment, the metal based interconnect structure may include metal lines having a "U" shape that exit on only one side of the dielectric body containing the metal based interconnect structure.

It is noted that the angled structures that provide the metal based electrically conductive lines 12a, 12b in FIG. 1A, and the curved structures that provide the metal based electrically conductive lines 12c, 12d, 12e, 12f, may be employed simultaneously with linear metal lines in the same substrate 13. For example, FIG. 1C illustrates linear metal lines identified by reference number 12g. Further details of the methods of the present disclosure are now discussed with greater detail with reference to FIGS. 2-7.

Figure 2:
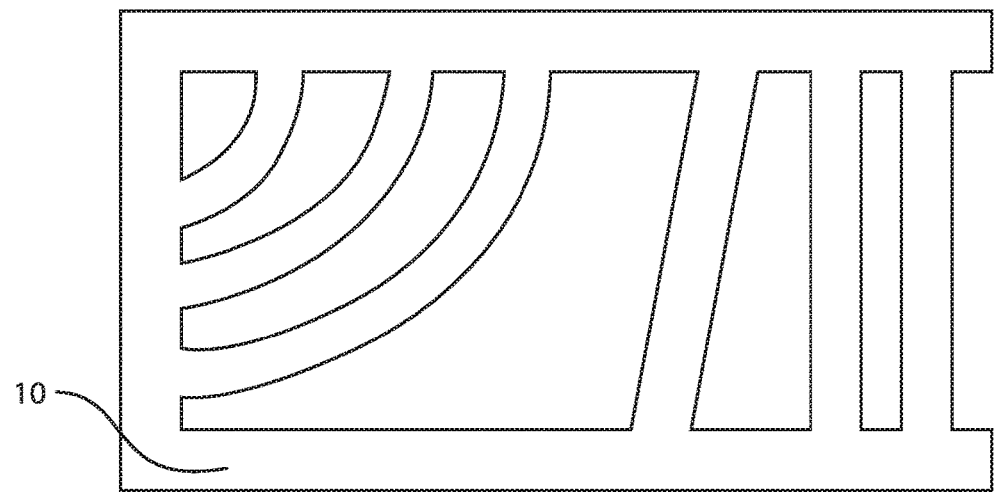
FIG. 2 is a side cross-sectional view depicting providing a trace structure using an additive forming method, the sacrificial trace structure having a geometry for the electrically conductive lines within the multi-chip carrier, in accordance with one embodiment of the present disclosure.

FIG. 2 depicts providing a trace structure 10 using an additive forming method. In some embodiments, the trace structure 10 may be sacrificial. The term 'sacrificial" denotes a structure that facilitates the formation of a material layer within a final device structure, yet the sacrificial structure is not present in the final device structure. The sacrificial trace structure 10 provides a structure having a geometry, e.g., including lines having angles or curvatures, that provides the geometry of the later formed metal based electrically conductive lines, e.g., the structures identified by reference numbers 12a, 12b, 12c, 12d, 12e, 12f and 12g in FIGS. 1A-1C. It is noted that in some embodiments, the trace structure 10 does not need to be removed from the final device structure.

Additive Manufacturing (AM) is an appropriate name to describe the technologies that build 3D objects by adding layer-upon-layer of material, whether the material is dielectric, plastic, metal, of semiconductor composition or combination thereof. The trace structure 10 is formed using a three dimensional additive manufacturing method selected from the group consisting of stereolithography, self-propagating waveguide formation, fused deposition modeling (FDM), selective laser sintering (SLS), continuous liquid interface production (CLIP), digital light processing (DLP), material jetting, and combinations thereof.

Stereolithography a technique or process for creating three-dimensional objects, in which a computer-controlled moving laser beam is used to build up the required structure, layer by layer, from a liquid polymer that hardens on contact with laser light. In some embodiments, a stereolithography technique provides a method to build a 3D microstructure in a layer-by-layer process, which can involve a platform (e.g., substrate) that is lowered into a photo-monomer bath in discrete steps. At each layer, a laser is used to scan over the area of the photo-monomer that is to be cured (i.e., polymerized) for that particular layer. Once the layer is cured, the platform is lowered by a specific amount (i.e., determined by the processing parameters and desired feature/surface resolution), and the process is repeated until the complete 3D structure is created.

Fused deposition modeling (FDM) is an additive manufacturing technology, which works on an "additive" principle by laying down material in layers; a plastic filament or metal wire is unwound from a coil and supplies material to produce a part. In some embodiments, FDM builds parts up layer-by-layer by heating and extruding thermoplastic filament.

Self-propagating waveguide formation typically includes the use of a polymer foam, or other cellular material. Self-propagating waveguide may for ordered open cellular polymer materials with micro-lattice structures and features. These materials can be formed by exposing a two-dimensional mask with a pattern of circular apertures that is covering a reservoir containing a photomonomer. More specifically, collimated UV light can be used to expose liquid polymer through a mask to form polymer waveguide. Within the photomonomer, self-propagating photopolymer waveguides originate at each aperture in the direction of the UV collimated beam and polymerize together at points of intersection. By simultaneously forming an interconnected array of these fibers in three-dimensions and removing the uncured monomer, three dimensional lattice-based open-cellular polymer materials can be fabricated, In one embodiments, the trace structure 10 is comprised of a polymeric material. When the trace structure 10 is formed using stereolithography, the trace structure 10 can be composed of a photohardenable resin compositions comprises of at least one photo-polymerizable compound, such as a photo-polymerizable modified urethane (meth)acrylate compound, an oligoester acrylate compound, an epoxyacrylate compound, an epoxy compound, a polyimide compound, an aminoalkyd compound, and a vinyl ether compound, as a main component, and a photosensitive polymerization initiator. When the trace structure 10 is formed using FDM, the trace structure 10 can be composed of Acrylonitrile Butadiene Styrene ABS, Polylactic acid PLA, Polycarbonate PC, Polyamide PA, Polystyrene PS, Polyether ether ketone PEEK, lignin, rubber, and combinations thereof. When the trace structure 10 is formed using self-propagating waveguide formation, the trace structure 10 may be composed of thiol-ene polymer.

It is noted that the above compositions for the trace structure 10 and additive manufacturing processes are provided for illustrative purposes and are not intended to limit the disclosed methods and structures to only the above examples. For example, in addition to the above examples, the trace structure 10 may also be formed using wire or textile layup, modular assembly, deformed perforated sheet lattice assembly, selective laser sintering (SLS), continuous liquid interface production (CLIP), digital light processing (DLP), material jetting, as well as other three dimensional additive methods.

The trace structure 10 may have linear metal line portions and non-linear metal line portions, e.g., angled portions and curved portions, to provide metal electrically conductive lines similar to the non-linear metal lines of the electrically conductive lines 12a, 12b, 12c, 12d, 12e, 12f depicted in FIGS. 1A and 1B, as well as the linear metal based electrically conductive lines 12g.

Figure 3:
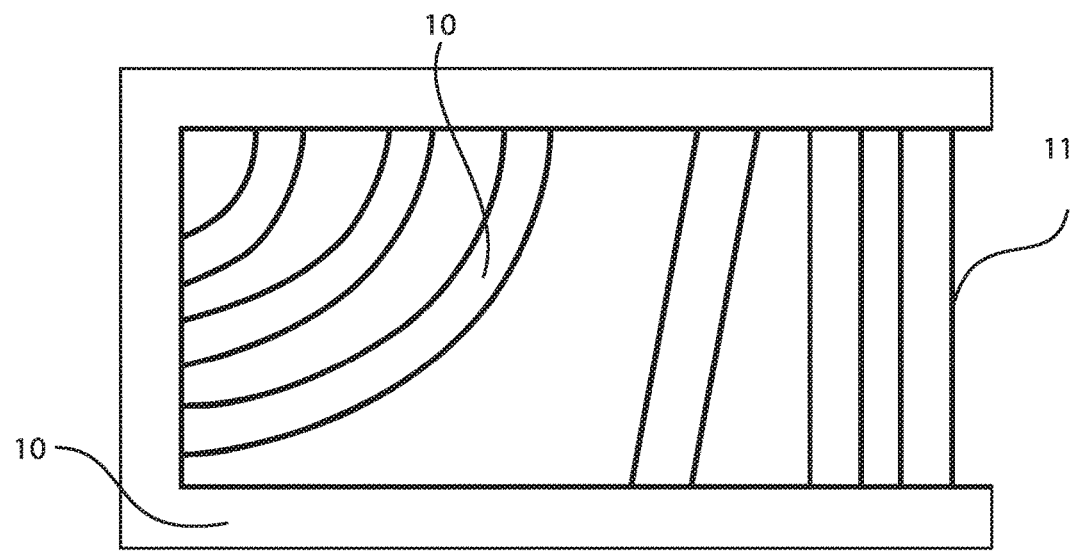
FIG. 3 is a side cross-sectional view depicting forming a continuous seed metal layer of a first metal composition on the sacrificial trace structure, in accordance with one embodiment of the present disclosure.
Figure 4:
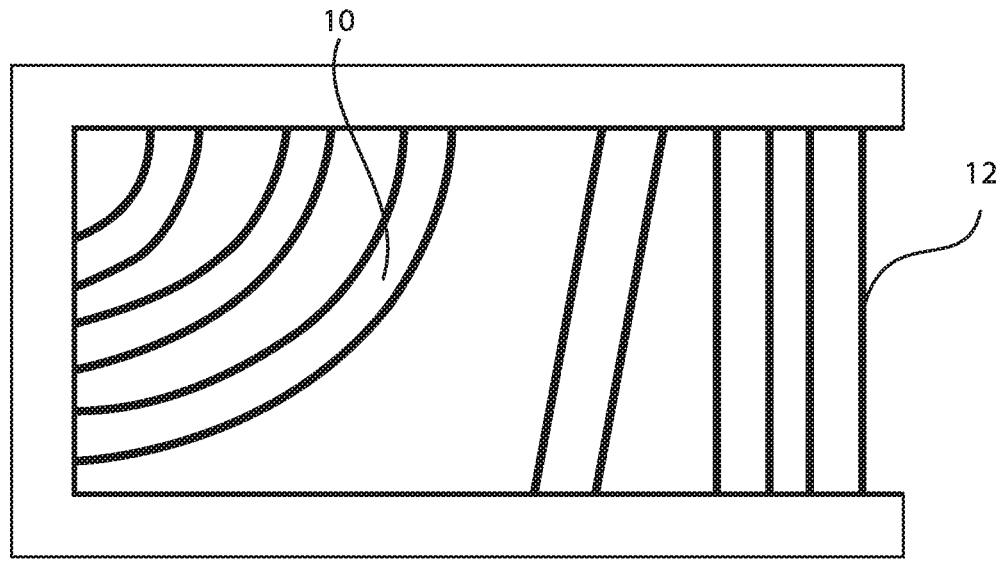
FIG. 4 is a side cross-sectional view depicting one embodiment of forming a continuous metal layer of a second metal composition on the continuous seed metal layer.

FIG. 3 depicts one embodiment of forming a continuous seed metal layer 11 on the trace structure 10. The continuous seed metal layer 11 may be composed of any metal, such as nickel, copper, aluminum, tungsten, titanium, platinum, gold, tin, silver, and combinations thereof. In some embodiments, the thickness of the continuous seed metal layer 11 is selected to provide a seed layer for subsequent metal depositions, and have a thickness that is suitable to not be removed during the optional process steps for removing the trace structure 10 (sacrificial trace structure). The continuous seed metal layer 11 is a deposited metal layer having a conformal thickness. The term "conformal" denotes a layer having a thickness that does not deviate from greater than or less than 30% of an average value for the thickness of the layer. By continuous it is meant that the continuous seed metal layer 11 is free of breaks.

The continuous seed metal layer 11 may be deposited using a physical vapor deposition (PVD) process. For example, the continuous seed metal layer 11 may be composed of nickel deposited using electroless plating. Electroless nickel plating (EN) is an auto-catalytic chemical technique used to deposit a layer of nickel-phosphorus or nickel-boron alloy. The process may employ a reducing agent, e.g., hydrated sodium hypophosphite ($NaPO_2H_2 \cdot H_2O$) which reacts with the metal ions to deposit metal. In other embodiments, the continuous seed metal layer 11 may be formed using electroplating and/or sputtering. In other embodiments, the continuous seed metal layer 11 may be formed using atomic layer deposition (ALD) or chemical vapor deposition (CVD), e.g., plasma enhanced chemical vapor deposition (PECVD). The thickness of the continuous seed metal layer 11 may have a thickness ranging from 5 nm to 100 µm. In another embodiment, the thickness of the continuous seed metal layer 11 may range from 10 nm to 50 nm. In another embodiment, the thickness of the continuous seed metal layer 11 may range from 1 µm to 100 µm. In some embodiments, the polymeric base material 9 may facilitate uniformity in the deposition of the continuous seed metal layer 11 on the portions of the trace structure 10 that subsequently provide the metal lines of the metal interconnect structure of the interposer.

It is noted that in some embodiments a block mask may be formed atop a portion of the trace structure 10 prior to forming the continuous seed metal layer 11 to select which portions of the trace structure 10 may be coated with the continuous seed metal layer 11.

Figure 5:
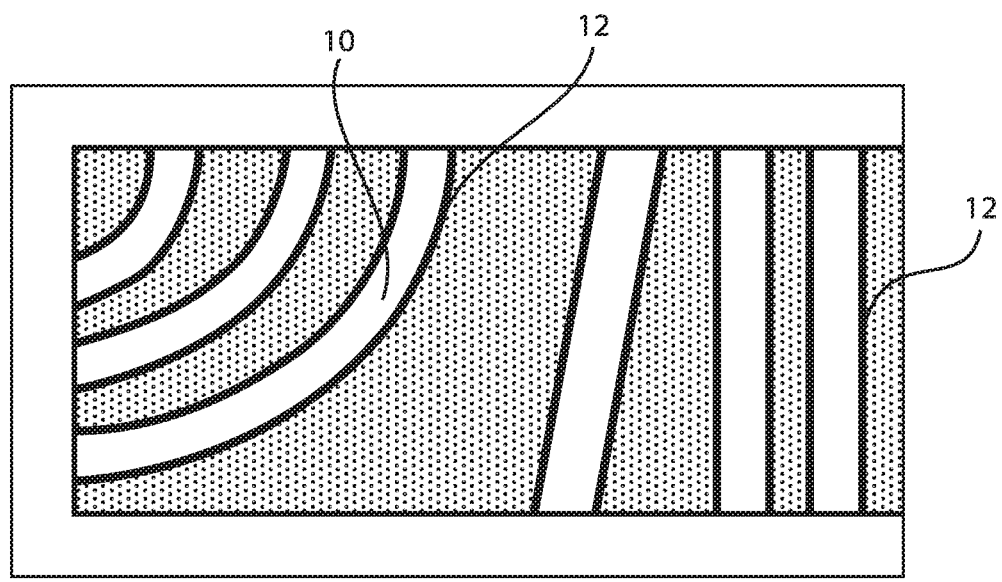
FIG. 5 is a side cross-sectional view depicting a dielectric material may then be formed on the interconnect metal layer to encapsulate a majority of the electrically conductive lines, in accordance with one embodiment of the present disclosure.

FIG. 5 depicts one embodiment of forming a continuous metal layer of a second metal composition 12 (hereafter referred to as metal line layer 12) on the continuous seed metal layer 11. The metal line layer 12 may be composed of any metal, such as the metal being deposited provides an electrically conducive material. For example, the metal line layer 12 may be composed of copper, nickel, aluminum, titanium, tungsten, tantalum, platinum, gold, tin, silver and combinations thereof. In some embodiments, the metal line layer 12 may be deposited using a physical vapor deposition (PVD) method, such as sputtering, evaporative deposition, and combinations thereof. In some embodiments, the metal line layer 12 may be deposited using a plating method, such as electrolytic plating, electroless plating, and combinations thereof. In one embodiment, the metal line layer 12 is formed composed of copper deposited using electroplating. One example of a plating bath composition that is suitable for electroplating the metal line layer 12 of copper may include a copper sulfate ($CuSO_4$) solution with sulfuric acid ($H_2SO_4$). In some embodiments, electroless deposition of copper (Cu) may rely on the presence of a reducing agent, for example formaldehyde (HCHO), which reacts with the copper (Cu) metal ions to deposit the metal. In some other embodiments, the metal for the metal line layer 12 may be deposited using a chemical vapor deposition (CVD) process, such as plasma enhanced chemical vapor deposition (PECVD) and metal organic chemical vapor deposition (MOCVD). In yet other embodiments, the metal for the metal line layer 12 may be deposited using atomic layer deposition (ALD). The metal line layer and the seed layer 11 provide the electrically conductive lines.

FIG. 5 depicts one embodiment of a dielectric material (dielectric material for the substrate 13) being formed on the metal line layer 12 to encapsulate a majority of the electrically conductive lines that extend through the substrate 13.

The dielectric material for encapsulating the electrically conductive lines can be composed of any dielectric or polymeric material that can be deposited in a manner that fills the voids between the interconnect metal layers 12 and provides the substrate 13 of the multi-chip carrier. In some embodiments, the dielectric material may be an oxide, nitride or oxynitride material. In some examples, the dielectric material may be selected from the group consisting of $SiO_2$, $Si_3N_4$, $SiOXN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyimides, polyphenylene oxide, or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the dielectric include any of the aforementioned materials in porous form, or in a form that changes during processing to or from being porous and/or permeable to being non-porous and/or non-permeable. The dielectric for the substrate 13 may be deposited using spin on deposition, chemical vapor deposition (CVD), injection molding, transfer molding, deposition from solution, and a vacuum may be employed to draw the dielectric material within narrow passageways to ensure that the dielectric material fully encapsulates the electrically conductive lines 12.

In some embodiments, the opposing sidewalls of the structure depicted in FIG. 5 may be planarized. Planarizing exposes the ends of the metal line layers 12 so that the electrically conductive lines extend through the dielectric material that provides the substrate 13, and provides points for being engaged in electrical communication to the structures that are engaged to the multi-chip carrier. The planarization process may be provided by grinding, polishing, chemical mechanical planarization (CMP) or a combination thereof.

Figure 6:
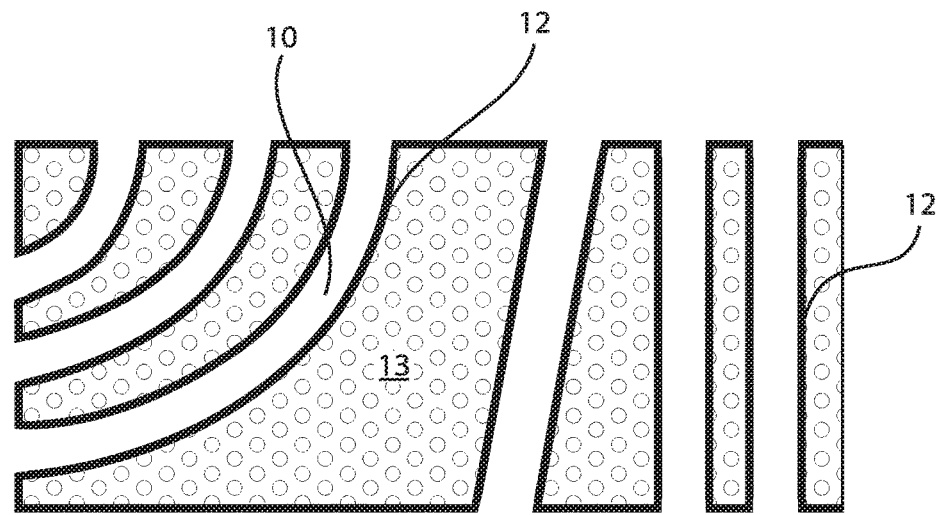
FIG. 6 is a side cross-sectional view depicting one embodiment of dissolving the sacrificial trace structure.

FIG. 6 depicts one embodiment of removing the trace structure 10, wherein the continuous seed metal layer 11 and the metal line layer 12 that provide the electrically conductive lines remains. In this embodiment, the trace structure 10 is sacrificial. The trace structure 10 may also be removed without removing the dielectric material of the substrate 13. In some embodiments, the trace structure 10 may be removed by dissolving the polymeric material of the sacrificial trace structure 10. In some embodiments, the trace structure 10 may be removed by an etch process that is selective to the electrically conductive lines and the dielectric material of the substrate 13. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The selective etch process may be a wet chemical etch or a dry etch. It is noted that removing the trace structure 10 is optional. In some embodiments, the trace structure 10 may remain in the final multi-chip carrier structure 100, 100a, 100b. In some embodiments, an additional plating step may be applied when the trace structure 10 is removed. The additional plating step applied after removing the trace structure 10 can increase the thickness of the electrically conductive lines. In the embodiments, in which the trace structure 10 is removed, the electrically conductive lines may encircle a hollow portion.

Figure 7:
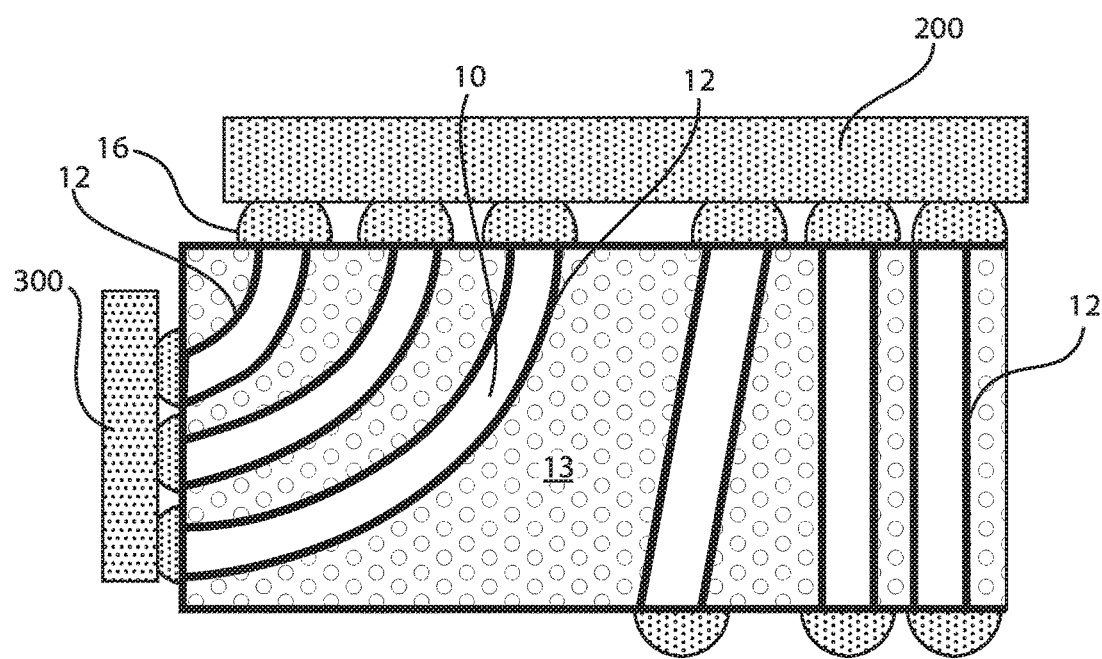
FIG. 7 is a side cross-sectional view depicting one embodiment of forming top processor solder bumps on the ends of the electrically conductive lines at the top processor mount location; forming side processor solder bumps on the ends of the electrically conductive lines at the at least one sidewall processor mount location; and bonding processors to the solder bumps.

FIG. 7 depicts solder bump processing of the structure depicted in FIG. 6. Solder bumps (also referred to as "solder balls"), such as C4 (controlled collapse chip connection) bumps, is used to bond a chip, i.e., first processors 200 and/or second processor 300, to the multi-chip carrier 100, 100a, 100b, or to bond the chip carrier to a circuit board, e.g., motherboard. The solder bumps/solder balls 16 are formed on the exposed ends of the electrically conductive lines (provided by the metal line layers 12 and the seed layer 11) at the top processor mount location S1 at the upper surface of the substrate 13, and on the exposed ends of the electrically conductive lines at the side processor mount location S2 at the sidewall surfaces of the substrate 13.

The term "solder", as used herein, refers to any metal or metallic compound or alloy that is melted and then allowed to cool in order to join two or more metallic surfaces together. Generally speaking, solders have melting temperatures in the range of 150° C. to 250° C. Solder bumps may be small spheres of solder (solder balls) that are bonded to contact areas, interconnect lines or pads of semiconductor devices. In some embodiments, a pad may be formed on the exposed edge surfaces of the interconnect structure prior to forming the solder, wherein the pad is composed of a material layer that the solder may adhere to. In some embodiments, the solder bumps can be made from lead-free solder mixtures or lead tin solder. The solder bumps 16 may be deposited using injection molded soldering (IMS), solder bumping, or sputtering. The solder bumps 16 may also be formed at on the electrically conductive lines that extend through the base surface of the substrate 13. In some embodiments, the row of solder bumps at the base surface of the substrate 13 may be substituted with a land grid array (LGA). The land grid array (LGA) is a type of surface-mount packaging for integrated circuits (ICs) that is notable for having the pins on the socket (when a socket is used) rather than the integrated circuit. The LGA pads may be soldered to the exposed surfaces of the metal interconnect structure 12. In some embodiments, the LGA pads may be formed using a photolithography and plating operation.

Following the formation of the solder bumps 16 on the top mount processor location S1 and the side mount processor location S2, the first and second processors 200, 300 may be mounted to the multi-chip carrier by bonding to the solder bumps 16. The multi-chip carrier may be bonded to a circuit board via solder bumps 16 or the structures integrated to the multi-chip carrier through the LGA pads.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming a chip carrier comprising:
providing a trace structure using an additive forming method, wherein the trace structure has a geometry that includes lines extending from a top processor mount locating at an upper surface of a substrate, and lines extending from at least one side processor mount location at a sidewall surface of the substrate;
forming a continuous metal seed layer on the trace structure;
forming a metal layer for electrically conductive lines on the continuous metal seed layer; and
forming a dielectric material for the substrate on the electrically conductive lines to encapsulate a majority of the electrically conductive lines, wherein ends of the electrically conductive lines are exposed through the upper surface at the top processor mount location and the ends of the electrically conductive lines that are exposed through sidewalls of the substrate are at the at least one sidewall processor mount location.

2. The method of claim 1, wherein the trace structure is comprised of a polymeric material.

3. The method of claim 1, wherein the trace structure is formed using a three dimensional additive method selected from a group consisting of stereolithography, self-propagating waveguide formation, fused deposition modeling (FDM), selective laser sintering (SLS), continuous liquid interface production (CLIP), digital light processing (DLP), material jetting, and combinations thereof.

4. The method of claim 3, wherein the continuous metal seed layer is composed of a metal selected from a group consisting of nickel, aluminum, copper, tantalum, titanium, platinum, tin, gold, and combinations thereof.

5. The method of claim 4, wherein the continuous metal seed layer is deposited using electroless plating.

6. The method of claim 2 further comprising removing the trace structure by dissolving the polymeric material after forming the electrically conductive lines.

7. The method of claim 1, wherein the metal layer is deposited using an electroplating process, physical vapor deposition, atomic layer deposition or chemical vapor deposition.

8. The method of claim 7, wherein the metal layer is composed of a metal selected from the group consisting of nickel, aluminum, copper, tantalum, titanium, platinum, tin and combinations thereof.

9. The method of claim 7, wherein solder bumps provide for engagement to a processor at the upper surface and sidewall surfaces of the substrate.

10. The method of claim 7, wherein the electrically conductive lines composed of the metal layer and the continuous metal seed layer have a hollow core.

11. The method of claim 1, wherein said forming the dielectric material on the electrically conductive lines comprises:
   deposition of the dielectric material by chemical vapor deposition, injection molding, transfer molding, or spin on deposition; and
   planarization of the dielectric material to expose ends of an interconnect metal layer.

12. A method of forming a chip carrier comprising:
   providing a trace structure using an additive forming method, wherein the trace structure has a geometry that includes lines extending from a top processor mount locating at an upper surface of a substrate, and lines extending from at least one side processor mount location at a sidewall surface of the substrate;
   forming a metal layer for electrically conductive lines on the trace structure;
   forming a dielectric material for the substrate on the electrically conductive lines to encapsulate a majority of the electrically conductive lines, wherein ends of the electrically conductive lines are exposed through the upper surface at the top processor mount location and A the ends of the electrically conductive lines that are exposed through sidewalls of the substrate are at the at least one sidewall processor mount location;
   forming top processor solder bumps on the ends of the electrically conductive lines; and
   bonding a top processor to the solder bumps at the top processor mount location and a side processor to the solder bumps at the at least one sidewall processor mount location.

13. The method of claim 12, wherein the trace structure is formed using a three dimensional additive method selected from the group consisting of stereolithography, self-propagating waveguide formation, fused deposition modeling (FDM), selective laser sintering (SLS), continuous liquid interface production (CLIP), digital light processing (DLP), material jetting, and combinations thereof.

14. The method of claim 13, further comprising forming a metal seed layer on the trace structure, wherein the metal layer is formed on the metal seed layer, the metal seed layer is composed of a metal selected from the group consisting of nickel, aluminum, copper, tantalum, titanium, platinum, tin, gold, and combinations thereof.

15. The method of claim 13, wherein the trace structure is comprised of a polymeric material; and removing the trace structure by dissolving the polymeric material.

* * * * *